US012642030B2

(12) United States Patent
Wang

(10) Patent No.: US 12,642,030 B2
(45) Date of Patent: May 26, 2026

(54) OXIDE REMOVAL FOR CONTACT PLUGS

(71) Applicant: Taiwan Semiconductor Manufacturing Co., Ltd., Hsinchu (TW)

(72) Inventor: Chao-Chun Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 815 days.

(21) Appl. No.: 17/830,124

(22) Filed: Jun. 1, 2022

(65) Prior Publication Data
US 2023/0395393 A1 Dec. 7, 2023

(51) Int. Cl.
| | |
|---|---|
| *H10P 52/40* | (2026.01) |
| *H10D 30/01* | (2025.01) |
| *H10D 30/43* | (2025.01) |
| *H10D 30/67* | (2025.01) |
| *H10D 64/01* | (2025.01) |
| *H10W 20/00* | (2026.01) |
| *H10W 20/41* | (2026.01) |

(52) U.S. Cl.
CPC ......... *H10P 52/403* (2026.01); *H10D 30/014* (2025.01); *H10D 30/031* (2025.01); *H10D 30/43* (2025.01); *H10D 30/6757* (2025.01); *H10D 64/017* (2025.01); *H10W 20/069* (2026.01); *H10W 20/435* (2026.01)

(58) Field of Classification Search
None
See application file for complete search history.

(56) References Cited

U.S. PATENT DOCUMENTS

| | | | | |
|---|---|---|---|---|
| 6,429,128 | B1 * | 8/2002 | Besser .............. | H01L 21/76834 |
| | | | | 438/653 |
| 6,743,310 | B1 * | 6/2004 | Ngo .......................... | C22F 3/00 |
| | | | | 257/E21.585 |
| 7,727,881 | B1 * | 6/2010 | Chattopadhyay ........................... | |
| | | | | H01L 21/76834 |
| | | | | 257/E21.582 |
| 2004/0115933 | A1 * | 6/2004 | Jung ................. | H01L 21/76883 |
| | | | | 257/E21.582 |
| 2005/0112877 | A1 * | 5/2005 | Miyajima ......... | H01L 21/76883 |
| | | | | 257/E21.582 |

(Continued)

FOREIGN PATENT DOCUMENTS

| | | |
|---|---|---|
| TW | 201628145 A | 8/2016 |
| TW | 201709501 A | 3/2017 |
| TW | 201725966 A | 7/2017 |

*Primary Examiner* — Benjamin P Sandvik
(74) *Attorney, Agent, or Firm* — Slater Matsil, LLP

(57) ABSTRACT

A method of forming a semiconductor device includes forming an electronic component over a substrate; forming a first insulating layer over the electronic component; forming a contact plug extending through the first insulating layer to the electronic component, wherein the contact plug includes a first portion formed of a conductive material and a second portion formed of an oxide of the conductive material disposed over the first portion; performing a treatment to expose the contact plug and the first insulating layer to a gas mixture of $N_2$ and $NH_3$; after performing the treatment, forming a second insulating layer over the contact plug and the first insulating layer; and forming an interconnect in the second insulating layer and in contact with the contact plug.

20 Claims, 15 Drawing Sheets

(56)          References Cited

U.S. PATENT DOCUMENTS

| 2007/0037388 A1* | 2/2007 | Hohage | C23C 16/0245 |
| | | | 257/E21.224 |
| 2013/0256888 A1* | 10/2013 | Shih | H01L 21/76807 |
| | | | 257/E21.585 |
| 2016/0225642 A1 | 8/2016 | Pai | |
| 2017/0186697 A1 | 6/2017 | Dias et al. | |
| 2021/0066122 A1* | 3/2021 | Lin | H01L 21/28562 |

* cited by examiner

OXIDE REMOVAL FOR CONTACT PLUGS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs.

Accompanying the scaling down of devices, manufacturers have begun using new and different materials and/or combination of materials to facilitate the scaling down of devices. Scaling down, alone and in combination with new and different materials, has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
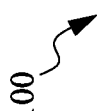
FIGS. 1, 2, 3, 4, 5, 6, 7, 8, 9, 10, 11, 12, 13, and 14 illustrate cross-sectional views of intermediate stages in the formation of semiconductor devices, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Methods for forming a semiconductor device, such as methods for forming tungsten contact plugs and an upper-level interconnect (e.g., metallization lines and vias), are provided in accordance with some embodiments of the present disclosure. For example, the methods for forming the semiconductor device provide a pre-deposition treatment that includes exposing contact plugs to a gas mixture of $NH_3$ and $N_2$ in suitable conditions. The pre-deposition treatment may reduce oxidized portions of the contact plugs to a metal element while preventing/reducing the formation of a nitride in or over the contact plugs. As a result, the subsequently formed upper-level interconnect may be in contact with the metal portions of the contact plugs, with little or no oxide or nitride formed therebetween. Low-resistance conducting routes between the contact plugs and the upper-level interconnect are provided.

FIGS. 1 through 6 illustrate cross-sectional views of intermediate stages in the formation of electronic components and interconnect structures of a semiconductor device 100, in accordance with some embodiments. FIG. 1 illustrates a cross-sectional view of a wafer comprising a substrate 110 (e.g., a semiconductor substrate) in which various electronic components may be formed over the substrate 110, in accordance with some embodiments. In subsequent figures, a multi-level interconnect structure may be formed over the various electronic components 120 and the substrate 110. Generally, as will be discussed in greater detail below, FIG. 1 illustrates the electronic components 120 formed over the substrate 110, with a multi-level interconnection structure formed thereover in later figures. The electronic components 120 may include a nanostructure field-effect transistors FET (nano-FET), as illustrated in FIG. 1. However, fin field-effect transistors (FinFET), planar transistors, and other types of electronic components, including various active or passive components, are within the contemplated scope of this disclosure.

Generally, the substrate 110 illustrated in FIG. 1 may comprise a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally comprise the crystalline semiconductor material silicon but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates.

In some embodiments, the electronic components 120 illustrated in FIG. 1 include nanostructures 122 (e.g., nanosheets, nanowires, nanoribbons) formed over strip-like fins 124, where the nanostructures 122 will act as channel regions for the electronic components 120. The cross-section shown in FIG. 1 is taken along a longitudinal axis of the fins 124 in a direction parallel to the direction of the current flow between the source/drain regions 134. In some embodiments, the nanostructures 122 are formed from a multilayer stack. The multilayer stack may include alternating layers of a first semiconductor material and a second semiconductor material formed over the substrate 110. In some embodiments, trenches are formed in the multi-stack and the substrate 110, thereby forming the nanostructures 122 of the first semiconductor material and nanostructures (not shown) of the second semiconductor material by patterning multi-stack and forming the fins 124 by patterning the substrate 110. The trenches may be formed by etching the multilayer stack and the substrate 110 according to a pattern defined by one or more photolithography processes, including double-patterning or multi-patterning processes. Generally, double-patterning or multi-patterning processes combine photoli-thography and self-aligned processes, allowing patterns to be created that have, for example, pitches smaller than what is otherwise obtainable using a single, direct photolithogra-phy process.

As will be discussed in greater detail below, the layers of second semiconductor material will be replaced with gate structures 132. For example, the first semiconductor material and the second semiconductor material may be materials having a high-etch selectivity to one another. As such, the second semiconductor material may be removed without significantly removing the first semiconductor material when replacing the layers of the second semiconductor material (e.g., nanostructures) with the gate structures 132. In some embodiments, the first semiconductor material is silicon, and the second semiconductor material is silicon germanium.

Shallow trench isolation (STI) regions 130 formed along opposing sidewalls of the fins 124 are illustrated in FIG. 1. The STI regions 130 may be formed by depositing one or more dielectric materials (e.g., silicon oxide) to completely fill the trenches around the fins 124 and the nanostructures and then recessing the top surface of the dielectric materials. The dielectric materials of the STI regions 130 may be deposited using a high-density plasma chemical vapor depo-sition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI regions 130 may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI regions 130.

In some embodiments, the gate structures 132 of the electronic components 120 illustrated in FIG. 1 are high-k, metal gate (HKMG) gate structures that may be formed using a gate-last process. In a gate-last process, sacrificial dummy gate structures (not shown) are formed after forming the STI regions 130. Each of the dummy gate structures may comprise a dummy gate dielectric, a dummy gate electrode, and a hard mask. First, a dummy gate dielectric material (e.g., silicon oxide, silicon nitride, silicon oxynitride, or the like) may be deposited. Next, a dummy gate material (e.g., amorphous silicon, polycrystalline silicon, or the like) may be deposited over the dummy gate dielectric and then planarized (e.g., by CMP). A hard mask (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. The dummy gate structures may be formed over the nanostruc-tures 122, the fins 124, and the upper surface of the STI regions 130. As described in greater detail below, the dummy gate structures may be replaced by the gate struc-tures 132 illustrated in FIG. 1. The gate structure 132 illustrated on the right side in FIG. 1 (seen on the top of and between the nanostructures 122) is a cross-section perpen-dicular to a longitude axis of the gate structure 132 (along a direction of current flow between the source/drain regions 134) and passing through the source/drain regions 134. The gate structure 132 on the left side in FIG. 1 is a cross-section along an axis perpendicular to the longitude axis of the gate structure 132 over the STI regions 130. The materials used to form the dummy gate structure and hard mask may be deposited using any suitable method such as CVD, plasma-enhanced CVD (PECVD), atomic layer deposition (ALD), plasma-enhanced ALD (PEALD), thermal oxidation, or combinations thereof.

Source/drain regions 134 and spacers 136 of the elec-tronic components 120, as illustrated in FIG. 1, are formed, for example, self-aligned to the dummy gate structures. Spacers 136 may be formed by deposition and anisotropic etching of a spacer dielectric layer performed after the dummy gate patterning. The spacer dielectric layer may include one or more dielectrics, such as silicon oxide, silicon nitride, silicon oxynitride, silicon carbide, silicon carboni-tride, the like, or a combination thereof. The anisotropic etching process removes the spacer dielectric layer from over the top of the dummy gate structures, leaving the spacers 136 along the sidewalls of the dummy gate struc-tures.

Source/drain regions 134 are semiconductor regions in contact with the nanostructures 122. In some embodiments, the source/drain regions 134 may comprise heavily-doped regions and relatively lightly-doped drain (LDD) extensions. Generally, the heavily-doped regions are spaced away from the dummy gate structures using the spacers 136, whereas the LDD regions may be formed prior to forming spacers 136 and, hence, extend under the spacers 136 and, in some embodiments, extend further into a portion of the semicon-ductor below the dummy gate structure. The LDD regions may be formed, for example, by implanting dopants (e.g., As, P, B, In, or the like) using an ion implantation process.

The source/drain regions 134 may comprise an epitaxially grown region. For example, after forming the LDD regions, the spacers 136 may be formed, and subsequently, the heavily-doped source/drain regions may be formed self-aligned to the spacers 136. In particular, the heavily-doped source/drain regions may be formed by first etching the fins to form recesses and then depositing a crystalline semicon-ductor material in the recess by a selective epitaxial growth (SEG) process that may fill the recess and, typically, extend beyond and above the original surface of the fin to form a raised source-drain structure, as illustrated in FIG. 1. The crystalline semiconductor material may be elemental (e.g., Si, or Ge, or the like), or an alloy (e.g., $Si_{1-x}C_x$, or $Si_{1-x}Ge_x$, $Si_{1-x-y}Ge_xC_y$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ cm$^{-2}$ to $10^{16}$ cm$^{-2}$) of dopants may be introduced into the heavily-doped source/drain regions 134 either in situ during SEG, or by an ion implantation process performed after the SEG, or by a combination thereof. The source/drain regions 134 may be formed by other processes, such as ion implantation of dopants and the like.

Still referring to FIG. 1, a first interlayer dielectric (ILD) 138 is deposited over the electronic components 120 and the STI regions 130. In some embodiments, a contact etch stop layer (CESL) (not shown) of a suitable dielectric (e.g., silicon nitride, silicon carbide, or the like, or a combination thereof) may be deposited over the source/drain regions 134 prior to depositing the first ILD 138. A planarization process (e.g., CMP) may be performed to remove the excess material of the first ILD 138 and any remaining hard mask material from over the dummy gates to form a top surface wherein the top surface of the dummy gate material is exposed and may be substantially coplanar with the top surface of the first ILD 138.

The dummy gate structures and the nanostructures of the second semiconductor material may be removed using one or more etching processes, thereby creating recesses between respective spacers 136 and gaps between the nanostructures 122. Next, a replacement gate dielectric material comprising one or more dielectrics, followed by a replacement conductive gate material comprising one or more conductive materials, may be deposited to completely fill the recesses and the gaps. The gate dielectric material includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, combinations thereof, or multilayers thereof. In some embodiments, the conductive gate material may be a multi-layered metal gate stack comprising a barrier layer, a work function layer, and a gate-fill layer formed successively on top of gate dielectric layer. Example materials for a barrier layer include TiN, TaN, Ti, Ta, TiSiN, TaSiN, or the like, or a multi-layered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess and gaps may comprise metals such as Cu, Al, W, Co, Ru, or the like, or combinations thereof, or multilayers thereof. The materials used for forming the HKMG gate layers may be deposited by any suitable method, e.g., CVD, PECVD, physical vapor deposition (PVD), ALD, PEALD, electrochemical plating (ECP), electroless plating and/or the like. Excess portions of the gate dielectric material and the conductive gate material may be removed from the top surface of the first ILD 138 using, for example, a CMP process, thereby forming gate dielectric layers 140 and conductive gate layers 144, respectively, collectively referred to as the gate structure 132. The resulting structure, as illustrated in FIG. 1, may be a substantially coplanar surface comprising an exposed top surface of the first ILD 138, the spacers 136, and the remaining portions of the HKMG gate layers (e.g., layers 140 and 144) inlaid between respective spacers 136.

In some embodiments, the gate dielectric layers 140 and the corresponding overlying conductive gate layers 144 between the opposing portions of spacers 136 are recessed. As a result, a recess is formed directly over the gate structure 132 and between opposing portions of spacers 136. A gate mask 148 comprising one or more layers of dielectric material, such as silicon nitride, silicon oxynitride, or the like, is filled in the recess, followed by a planarization process to remove excess portions of the dielectric material extending over the first ILD 138. Subsequently formed contact plugs 165*b* (discussed below with respect to FIG. 4) may penetrate through the gate mask 148 to contact the top surface of the conductive gate layer 144.

A second ILD 150 may be deposited over the first ILD 138, as illustrated in FIG. 1. In some embodiments, the insulating materials to form the first ILD 138 and the second ILD 150 may comprise silicon oxide, phosphosilicate glass (PSG), borosilicate glass (BSG), boron-doped phosphosilicate glass (BPSG), undoped silicate glass (USG), a low dielectric constant (low-k) dielectric such as fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the first ILD 138 and the second ILD 150 may be deposited using any suitable method, such as CVD, PVD, ALD, PEALD, PECVD, SACVD, FCVD, spin-on, and/or the like, or a combination thereof.

FIG. 1 further illustrates the formation of openings 152*a* and openings 152*b*. Opening 152*a* will subsequently be used to form a contact plug 165*a* (see below, FIG. 4) through the second ILD 150, the first ILD 138, and the CESL (if present) to the source/drain regions 134. Opening 152*b* will subsequently be used to form a contact plug 165*b* (see below, FIG. 4) through the second ILD 150 and the gate mask 148 to the conductive gate layer 144 of the gate structure 132. In some embodiments, the openings 152*a* and 152*b* are formed using suitable photolithography and etching processes. In some embodiments, the openings 152*a* and 152*b* may be etched through the second ILD 150 and the first ILD 138 using a first etching process; may be etched through the gate mask 148 using a second etching process; and may then be etched through the CESL (not shown) using a third etching process. In some embodiments, the etching process may over-etch, and therefore, the openings 152*a* and 152*b* extend into the source/drain regions 134 and/or the gate structure 132, respectively, and a bottom of the openings 152*a* and 152*b* may be level with (e.g., at the same level, or having a same distance from the substrate), or lower than (e.g., closer to the substrate) top surfaces of the source/drain regions 134 and/or the gate structures 132, respectively.

Figure 2:
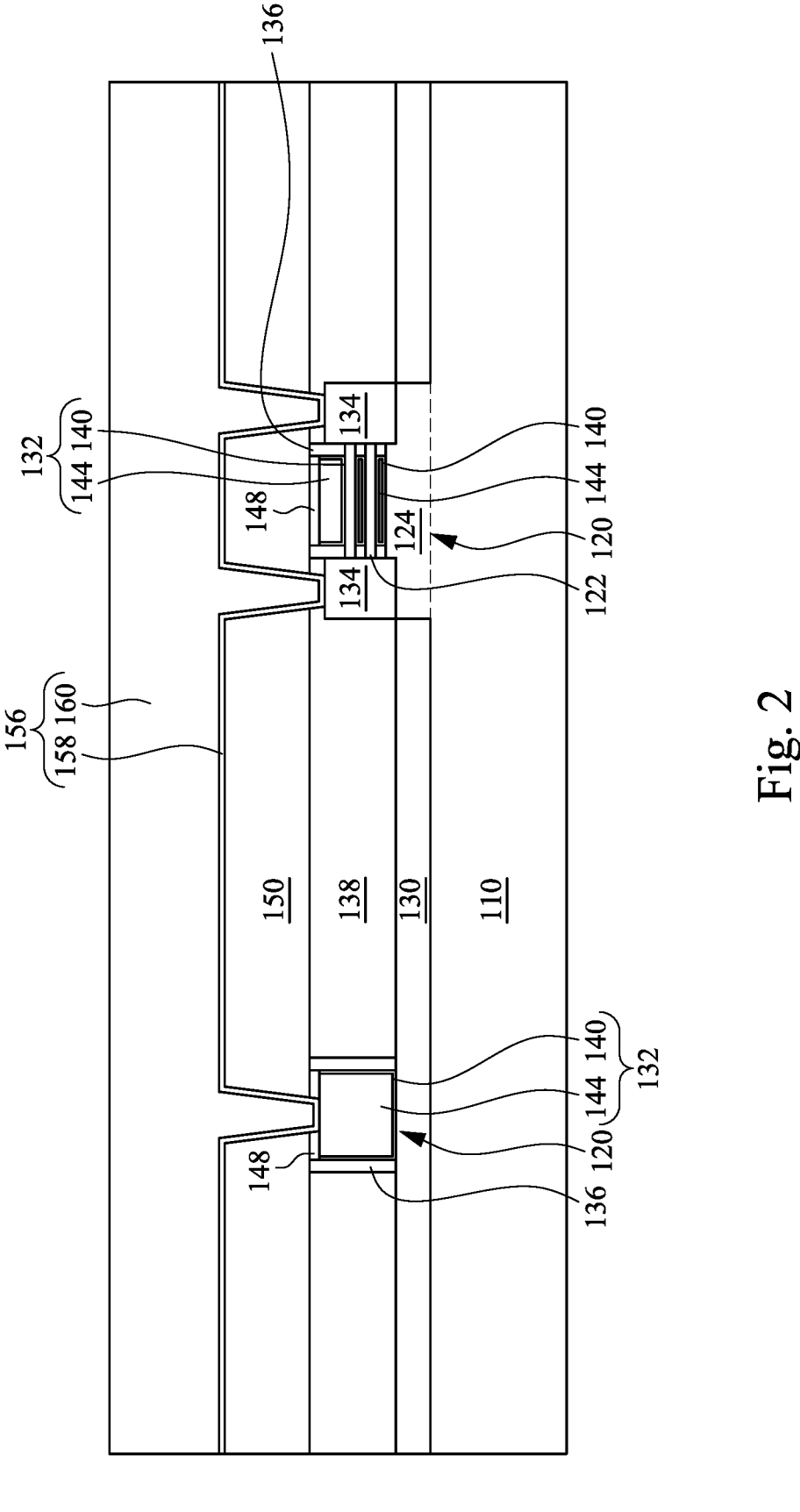

In FIG. 2, a conductive layer 156 may be deposited in the openings 152*a* and 152*b* and over the second ILD 150 in accordance with some embodiments. The conductive layer 156 may include one or more layers. For example, in some embodiments, the conductive layer includes a conductive liner 158 and a conductive fill layer 160 over the conductive liner 158. The conductive liner 158 may include barrier metals used to reduce out-diffusion of conductive materials from the conductive fill layer 160 into the surrounding dielectric materials. In some embodiments, the conductive liner 158 may comprise two barrier metal layers. The first barrier metal comes in contact with the semiconductor material in the source/drain regions 134 and may be subsequently chemically reacted with the heavily-doped semiconductor in the source/drain regions 134 to form a low-resistance ohmic contact, after which the unreacted metal may be removed. For example, if the heavily-doped semiconductor in the source/drain regions 134 is silicon or silicon-germanium alloy semiconductor, then the first barrier metal may comprise Ti, Ni, Pt, Co, other suitable metals, or their alloys. The second barrier metal layer of the conductive liner 158 may additionally include other metals (e.g., TiN, TaN, Ta, or other suitable metals, or their alloys). The conductive fill layer 160 may be formed of a conductive material such as tungsten or its alloy. The conductive fill layer 160 may be deposited over the conductive liner 158 to fill the openings 152*a* and 152*b*, using any acceptable deposition technique (e.g., CVD, ALD, PEALD, PECVD, PVD, ECP, electroless plating, the like, or any combination thereof).

Figure 3:
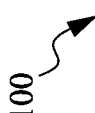

In FIG. 3, a planarization process is performed to remove excess conductive layer 156 over the second ILD 150, thereby forming contact plugs 164*a* in the openings 152*a* and contact plugs 164*b* in the openings 152*b*. The contact plugs 164*a* may extend through the first and second ILDs 138 and 150 and the CESL (not shown) to make physical and electrical connections to electrodes of electronic components, such as the source/drain regions 134 of the electronic components 120. The contact plugs 164*b* may extend through the second ILD 150 and the gate masks 148 to make physical and electrical connections to electrodes of electronic components, such as the gate structures 132 of the electronic components 120.

The planarization process may be a chemical mechanical polish (CMP) process. The CMP process may include a polishing step for removing the excess conductive layer 156 over the second ILD 150 and a wet cleaning step for removing residues or other contaminants left on top surfaces of the contact plugs 164*a*, top surfaces of the contact plugs 164*b*, and the top surface of the second ILD 150. In some embodiments, the wet cleaning step includes brushing and washing the top surfaces of the contact plug 164*a* and 164*b* and the second ILD 150 with a cleaning solution. In some embodiments, the cleaning solution is deionized (DI) water. In some embodiments, the cleaning solution is deionized (DI) water with an acid, such as dicarboxylic acid, hydrofluoric acid (HF), or phosphoric acid (H3PO4), or a base, such as ammonium hydroxide (NH4OH). In some embodiments, the cleaning solution may be a mixed solution such as a mixture of NH4OH, hydrogen peroxide (H2O2), and DI water or a mixture of ammonium hydrogen fluoride (NH4F), HF, and DI water.

The wet cleaning step of the CMP process may remove residues or other contaminants on the top surfaces of the contact plugs 164*a* and 164*b* and the second ILD 150, but it may also oxidize an upper portion of the contact plugs 164*a* and 164*b*. As such, one resulting contact plug 164*a*, among other things, may include a first portion 160*a* formed of the conductive material disposed over the conductive liner 158*a* and a second portion 162*a* formed of oxide of the conductive material disposed over the first portion 160*a*. One resulting contact plug 164*b*, among other things, may include a first portion 160*b* formed of the conductive material disposed over the conductive liner 158*b* and a second portion 162*b* formed of oxide of the conductive material disposed over the first portion 160*b*. In some embodiments, second portions 162*a* and 162*b* of the contact plugs 164*a* and 164*b*, respectively, are formed of tungsten oxide, which has a poor conductivity compared to tungsten metal and may be difficult to be fully removed by suitable etching processes. Note that the illustrated CMP process is only one method that may cause the oxidation of the contact plugs 164*a* and 164*b*, other methods, such as being exposed under an oxygen-containing environment (e.g. air), may cause the oxidization. In some embodiments, the second portions 162*a* and 162*b* have a thickness of about 2 nm to about 5 nm.

Figure 4:
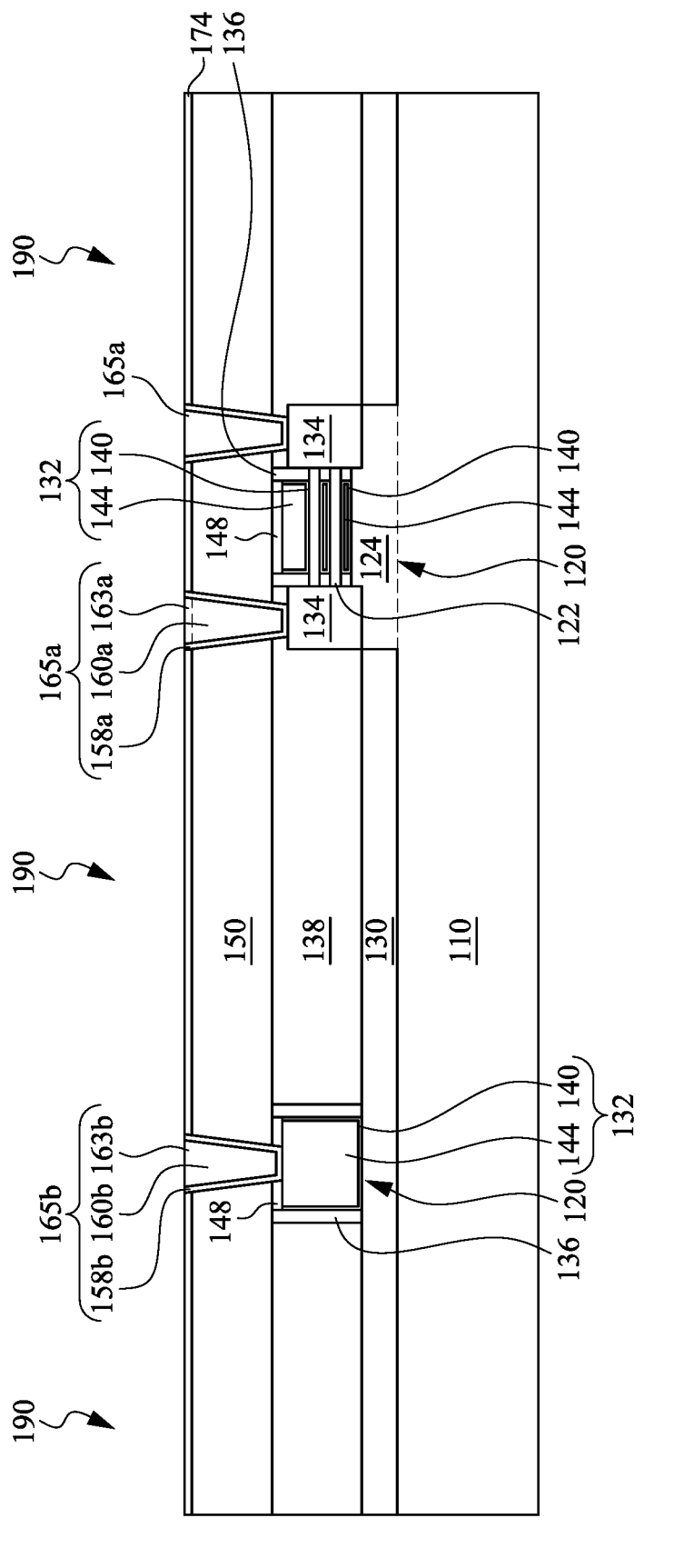
Figure 15:
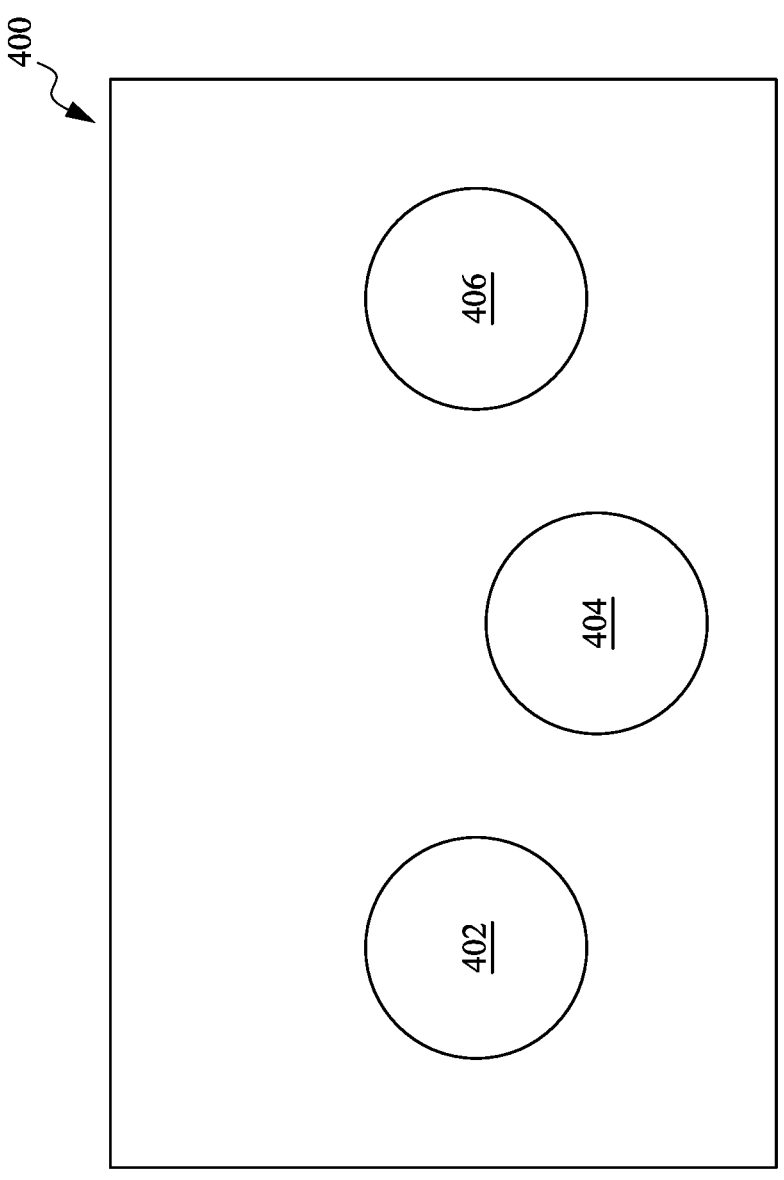
FIG. 15 illustrates a top view of a deposition tool, in accordance with some embodiments.

FIG. 4 illustrates performing a pre-deposition treatment in accordance with some embodiments. After the planarization process, the wafer (e.g., semiconductor device 100) may be transferred to a first chamber 402 of a deposition tool 400 (see FIG. 15), such as a CVD tool or a PECVD tool. As discussed in greater detail below, an etch stop layer and another ILD are deposited over the second ILD 150. Prior to forming the etch stop layer and another ILD, a pre-deposition treatment may be performed to convert the oxide of the conductive material in the second portions 162*a* and 162*b* of the contact plugs 164*a* and 164*b*, respectively, to a metal state of the conductive material (e.g., reducing tungsten oxide to tungsten metal), thereby forming the contact plugs 165*a* and 165*b*, respectively. In the contact plugs 165*a* and 165*b*, both of the first portions 160*a* and 160*b* and the second portions 163*a* and 163*b* are formed of the conductive material (e.g., tungsten metal) and substantially oxide free.

In some embodiments, the pre-deposition treatment 190 includes providing a plasma of a gas mixture of N¬2¬ and NH3 in the first chamber 402. A concentration ratio of N2 to NH3 in the gas mixture may be about 2 to about 16. The plasma may be provided by a radio frequency (RF) generator with power in a range of 400 Watts to 800 Watts (e.g., 600 W) and a frequency in a range of 10 to 20 Mhz (e.g., 13.5 Mhz). The N2 flow rate in the first chamber 402 may be about 4000 sccm to 4500 sccm, and the NH3 flow rate in the first chamber 402 may be about 275 sccm to 2000 sccm. The pre-deposition treatment 190 may be performed at a chamber temperature of about 340° C. to about 500° C., such as 400° C. In some embodiments, the pre-deposition treatment 190 is performed for about 12 seconds to about 24 seconds. In some embodiments, the pre-deposition treatment 190 provides H ions in a concentration of about $2 \times 1010$ atoms/cm-3 to about $5 \times 1010$ atoms/cm-3.

During the pre-deposition treatment 190, the hydrogen ions of $NH_3$ may react with the tungsten oxide, acting as a reducing agent to reduce tungsten oxide to a tungsten metal. The hydrogen ions may have a greater reaction rate with the tungsten oxide than nitrogen ions or atoms so that substantially no tungsten nitride is formed in and over the contact plugs 165*a* and 165*b* in the pre-deposition treatment. The nitrogen ions or atoms dissociated from $NH_3$ and $N_2$ may instead react with an upper portion of the second ILD 150, thereby forming an insulating layer 174 over the second ILD 150. For example, in embodiments in which the second ILD 150 is silicon oxide, the insulating layer 174 may be silicon nitride, silicon oxynitride, or a combination thereof. In some embodiments, the top surface of the insulating layer 174 is substantially level with the top surfaces of contact plugs 165*a* and 165*b*. In some embodiments, the insulating layer 174 has a thickness of about 1 nm to about 2 nm.

The addition of $N_2$ in the gas mixture may also help prevent/reduce etching of the second ILD 150 during the pre-deposition treatment 190. In some embodiments, the $NH_3$ may etch the material of the second ILD 150. For example, in embodiments in which the second ILD 150 comprises silicon oxide, the $NH_3$ may etch and damage the second ILD 150 during the pre-deposition treatment. The addition of $N_2$ in the gas mixture may prevent/reduce the etching of the second ILD 150.

It is noted that in the pre-deposition treatment 190, too high of a concentration of $NH_3$ in the gas mixture (e.g., the concentration ratio of $N_2$ to $NH_3$ lower than 2) would generate excessive hydrogen ions. These excessive hydrogen ions may diffuse into features below the contact plugs 165*a* and 165*b*, such as the source/drain regions 134 or the gate structures 132, and result in damage to them. Too high chamber temperature or too long time period of pre-deposition treatment 190 may also generate excessive H ions. In addition, having an excess amount of $NH_3$ as compared to $N_2$ may allow the $NH_3$ to etch and damage the second ILD 150. On the other hand, in some embodiments where the concentration ratio of $N_2$ to $NH_3$ of the gas mixture is too high (e.g., the concentration ratio of $N_2$ to $NH_3$ higher than 16), the chamber temperature is too low, and/or the time period of the pre-deposition treatment 190 is not long enough, the pre-deposition treatment 190 may not sufficiently reduce the oxide in the second portions 162*a* and 162*b* of contact plugs 164*a* and 164*b*, thereby causing a higher contact resistance.

Figure 5:
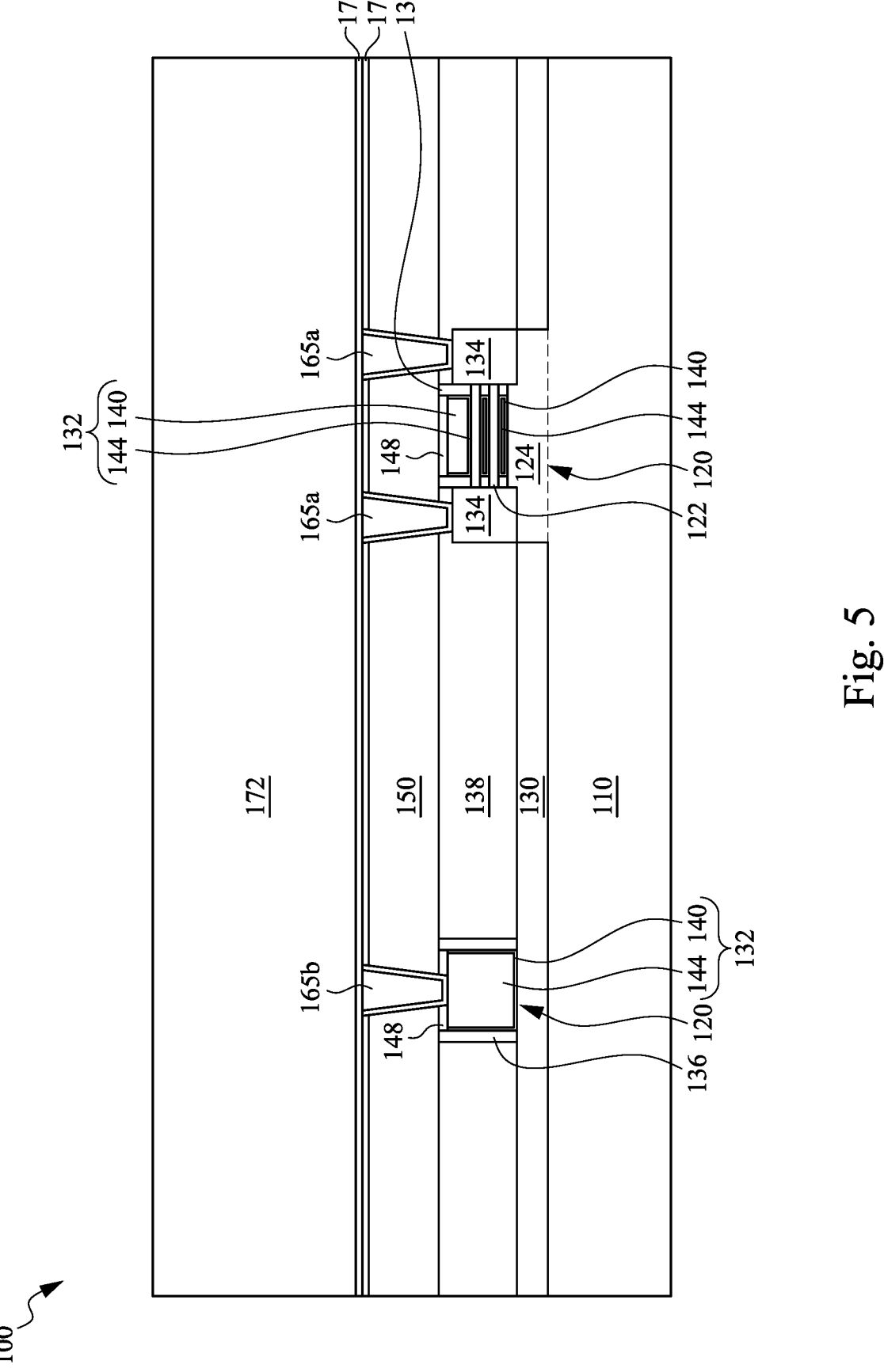

In FIG. 5, the wafer (e.g., semiconductor device 100) is transferred to a second chamber 404 (see FIG. 15) of the deposition tool 400 for depositing the ESL 170, in accordance with some embodiments. The ESL 170 may be deposited over the second ILD 150 and the contact plugs 165*a* and 165*b* using CVD or PECVD. The ESL 170 may include aluminum oxide, aluminum nitride, silicon carbide, or combinations thereof. In some embodiments, the ESL 170 has a thickness of about 20 Å to about 200 Å, such as about 100 Å. In some embodiments, the deposition tool 400 provides a substantial vacuum environment for the routes of transferring wafers between chambers. The wafer may be transferred from the first chamber 402 and the second chamber 404 under a substantial vacuum environment. As such, the contact plugs 165*a* and 165*b* may not be exposed to air or oxygen before the exposed top surfaces of the contact plugs 165*a* and 165*b* are sealed by the ESL 170, thereby preventing/reducing the contact plugs 165*a* and 165*b* from being oxidized during the wafer transferring.

Still referring to FIG. 5, the wafer (e.g., semiconductor device 100) is transferred to a third chamber 406 (see FIG. 15) of the deposition tool 400 for depositing the third ILD 172 over the ESL 170. The third ILD 172 may be a layer formed from a low-k dielectric material having a k-value lower than about 3.0. In some embodiments, the third ILD 172 is formed from a porous material such as SiOCN, SiCN, SiOC, SiOCH, or the like and may be formed by initially forming a precursor layer over the ESL 170. The precursor layer may include both a matrix material and a porogen interspersed within the matrix material, or may alternatively include the matrix material without the porogen. In some embodiments, the precursor layer may be formed, for example, by co-depositing the matrix and the porogen by PECVD where the matrix material is deposited at the same time as the porogen, thereby forming the precursor layer with the matrix material and the porogen mixed together. However, in some embodiments, co-deposition using a simultaneous PECVD process is not the only process that may be used to form the precursor layer.

The matrix material, or base dielectric material, may be formed using a process such as PECVD, although any suitable process, such as a CVD may alternatively be utilized. The PECVD process may utilize precursors such as methyldiethoxysilane (DEMS), although other precursors such as other silanes, alkylsilanes (e.g., trimethylsilane and tetramethylsilane), alkoxysilanes (e.g., methyltriethoxysilane (MTEOS), methyltrimethoxysilane (MTMOS), methyldimethoxysilane (MDMOS), trimethylmethoxysilane (TMMOS) and dimethyldimethoxysilane (DMDMOS)), linear siloxanes and cyclic siloxanes (e.g., octamethylcyclotetrasiloxane (OMCTS) and tetramethylcyclotetrasiloxane (TMCTS)), combinations of these, or the like may alternatively be utilized. In some embodiments, the porogen is molecule that can be removed from the matrix material after the matrix material has set in order to form pores within the matrix and thereby reduce the overall value of the dielectric constant of the third ILD 172. In some embodiments, the porogen may include alpha-terpinene (ATRP) (1-Isopropyl-4-Methyl-1,3-Cyclohexadiene), cyclooctane (boat shape), 1,2-bis(triethoxysilyl) ethane silicon or combinations thereof.

After the precursor layer has been formed with the porogen dispersed within the matrix material, the porogen is removed from the matrix material to form the pores within the matrix material. In an embodiment the removal of the porogen is performed by an annealing process which can break down and vaporize the porogen material, thereby allowing the porogen material to diffuse and leave the matrix material, thereby leaving behind a structurally intact porous dielectric material as the third ILD 172. For example, an anneal in a range from about 200° C. and about 1100° C., such as about 400° C., for in a range from about 10 seconds to about 1200 seconds, such as about 200 seconds, may be utilized. Alternatively, other suitable processes may be used to remove the porogen, such as irradiating the porogen with ultraviolet (UV) radiation to decompose the porogen or utilizing microwaves to decompose the porogen.

Figure 6:
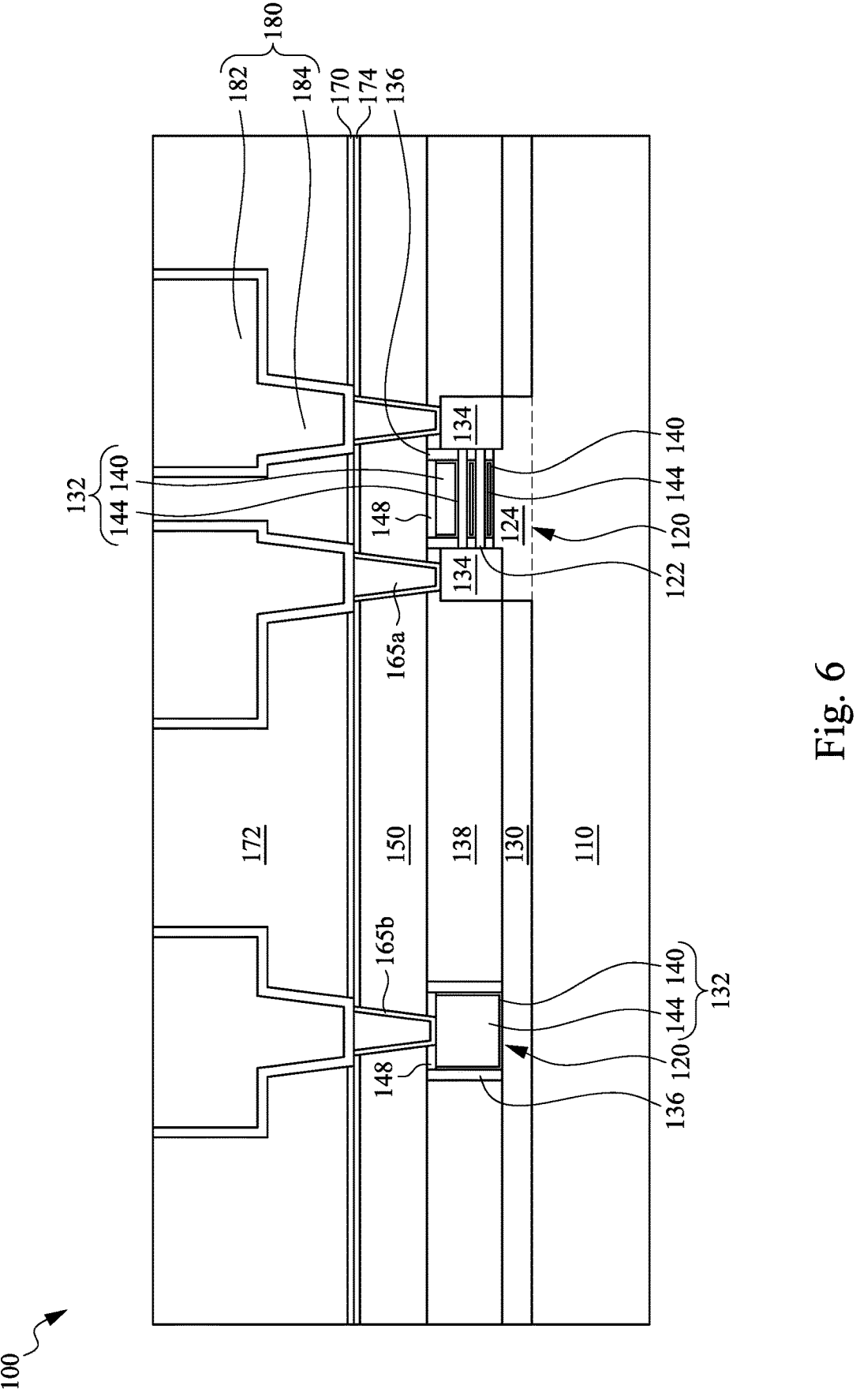
Figure 7:
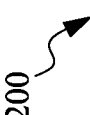

In FIG. 6, an upper-level interconnect 180 (referred to as interconnect 180 hereinafter) is formed in the third ILD 172 and the ESL 170 in accordance with some embodiments. The interconnect 180 may include metallization lines 182 and conductive vias 184 that vertically connect the metallization lines 182 to the contact plugs 165*a* and 165*b*. For example, the formation of the interconnect 180 may include forming openings for housing the metallization lines 182 in the third ILD 172 and openings for housing the conductive vias 184 in the third ILD 172, where the openings for housing the conductive vias 184 may expose portions of the ESL 170. The etching process for forming the openings may include the formation of a reactive species from an etchant gas using plasma. In some embodiments, the plasma may be a remote plasma. The etchant gas may include fluorocarbon chemicals such as $C_4F_6$, $CF_4$, $C_5F$, $NF_3$, the like, or a combination thereof. In some embodiments, the etchant gas uses fluorocarbon chemicals with $O_2$ or Ar as the carrier gas.

Portions of ESL 170 are removed from the openings for housing the conductive vias 184 to expose the underlying contact plugs 165*a* and 165*b* in accordance with some embodiments. The ESL 170 may be removed using an anisotropic dry etch that is selective to the materials of the insulating layer 174 and the contact plugs 165*a* and 165*b*. As such, the resulting openings may expose the underlying contact plugs 165*a* and 165*b*. In some embodiments, the process of etching the third ILD 172 and/or ESL 170 may be stopped by the insulating layer 174, even if when over-etching happens, and the second ILD 150 is protected from being damaged during the formation of the interconnect 180.

Next, a conductive layer is formed in the openings. The conductive layer may include one or more layers. For example, in some embodiments, the conductive layer comprises a conductive liner and a conductive fill material over the conductive liner. The conductive liner may include Ta, TaN, Ti, TiN, or combinations thereof, and the conductive fill material may include a metal or a metal alloy such as copper, silver, gold, aluminum, alloys thereof, or combinations thereof. In some embodiments, the formation of the conductive fill material includes depositing a thin seed layer (not shown), which may include copper or a copper alloy, and filling the rest of the openings by ECP, such as high voltage ECP. In some embodiments, the formation of the conductive fill material using CVD, PVD, or electroless plating.

A planarization process may be performed to remove excess of the conductive layer, thereby forming the interconnect 180 having the metallization lines 182 and the conductive vias 184. The planarization process may be a grinding process or a CMP process, and it may be performed such that the top surfaces of the conductive fill material, the conductive liner, and the third ILD 172 are level or are substantially level. In some embodiments, the conductive vias 184 land on the contact plugs 165*a* and 165*b* and the insulating layer 174. Following completion of the interconnect 180, additional metallization lines (not shown) and additional conductive vias (not shown) may be formed over the metallization lines 182.

In FIGS. 7-13, a semiconductor device 200 and methods for forming thereof are illustrated in accordance with some embodiments. The semiconductor device 200 may be formed by similar processing steps with similar reference numerals referring to similar elements as illustrated in the methods for forming the semiconductor device 100, wherein forming source/drain contact plugs and gate contact plugs are performed in separate steps and are treated separately.

Figure 8:
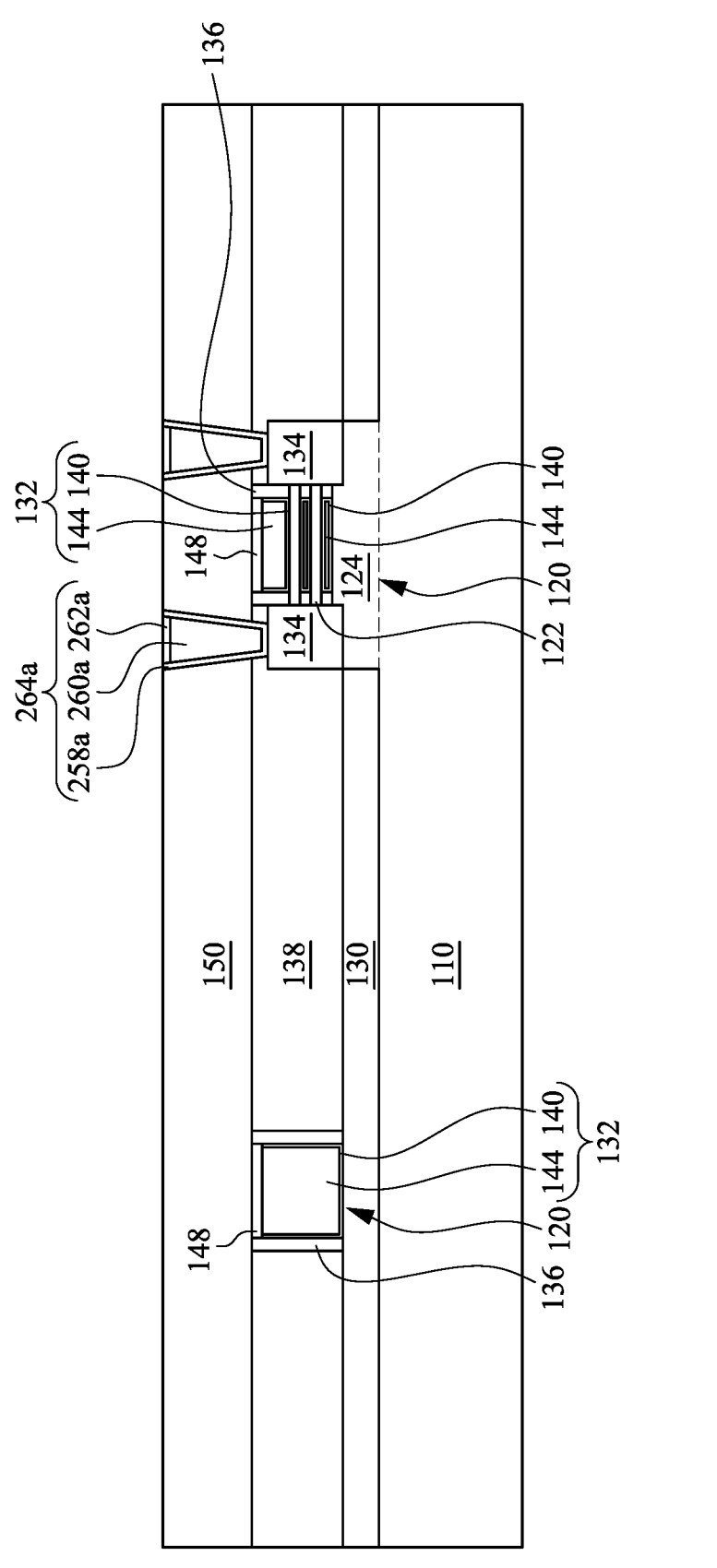
Figure 9:
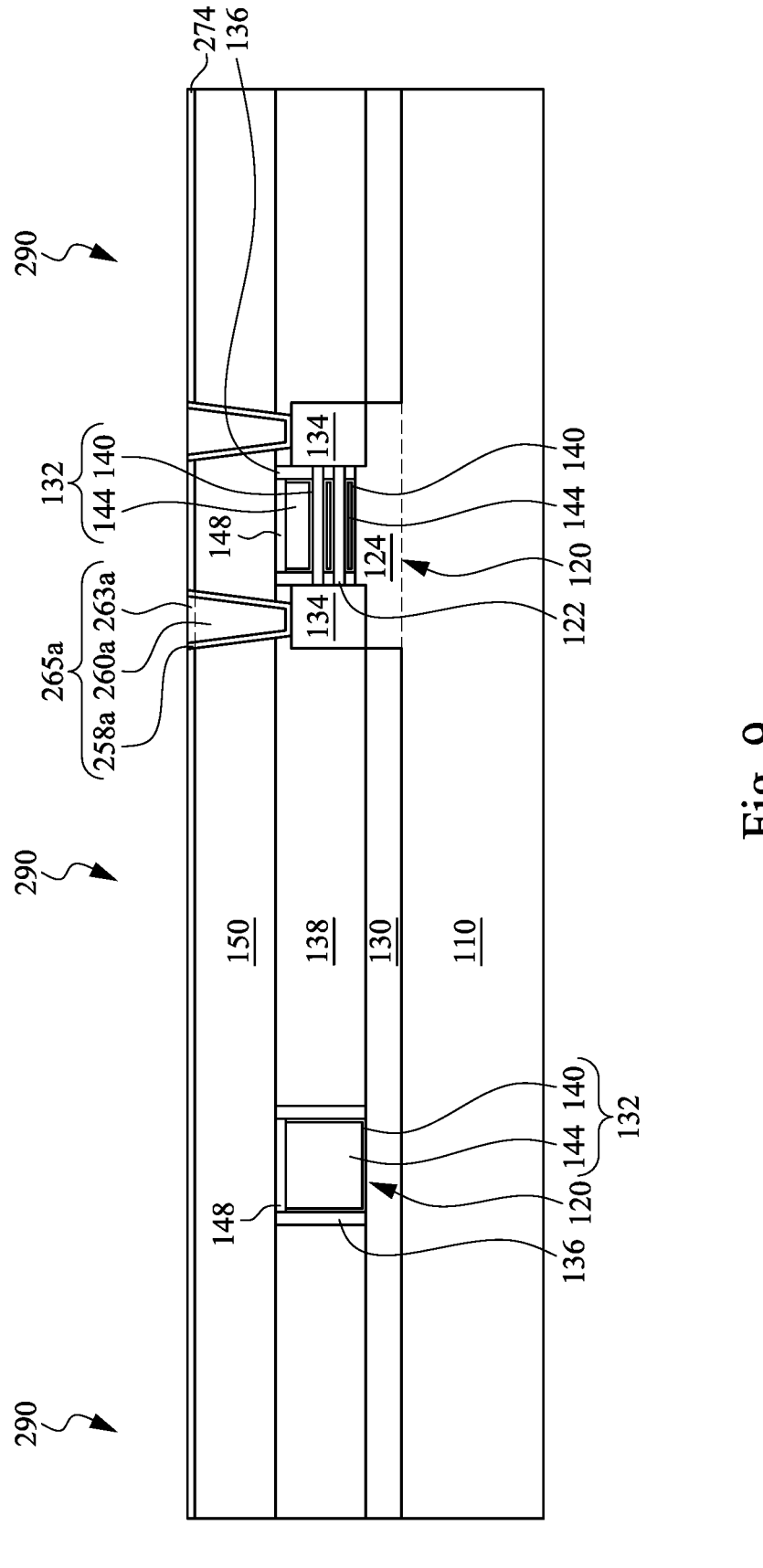

In FIG. 8, openings 252a are formed in the first ILD 138 and the second ILD 150 in accordance with some embodiments. The openings 252a may be formed using similar processes as the openings 152a, where the photolithography and etching processes for forming the openings 252a do not include forming openings exposing the gate structure 132. In FIG. 9, a conductive layer is formed in the openings 252a and over the first ILD 138 and then planarized to form the contact plugs 264a in the openings 252a using the same material and formation processes illustrated in FIGS. 1-7. In some embodiments, the contact plugs 264a have the same characteristics or properties as the contact plugs 164a illustrated in FIG. 3. In some embodiments, the contact plugs 264a may include one or more layers. For example, in some embodiments, the contact plugs 264a include a conductive liner 258a and a first portion 260a formed of the conductive material over the conductive liner 258a, and a second portion 262a formed of oxide of the conductive material disposed over the first portion of the contact plugs 264a. The conductive liner 258a, the first portion 260a of the contact plugs 264a, and the second portion 262a of the contact plugs 264a may have the same or similar characteristics or properties as the conductive liner 158a, the first portion 160a of the contact plugs 164a, and the second portion 162a of the contact plugs 164a, respectively.

In FIG. 9, a first treatment 290 is performed to convert the oxide of conductive material in the second portions 262a of the contact plugs 264a to a metal state of the conductive material (e.g., reducing tungsten oxide to tungsten metal), thereby forming the contact plugs 265a. In the contact plugs 265a, both of the first portions 260a and second portions 263a may be formed of the conductive material (e.g., tungsten metal) and substantially oxide free.

The first treatment 290 may be the same as the pre-deposition treatment 190, wherein the first treatment 290 may be performed in any tool other than the deposition tool 400. For example, the first treatment 290 may be performed in any tool that is able to provide a gas mixture of $N_2$ and $NH_3$, such as the etching tool for forming the openings 252a, which may save time by omitting transferring wafer between different tools. By performing the first treatment 290, an insulating layer 274 may be formed over the second ILD 150. In some embodiments, the insulating layer 274 may have the same characteristics or properties same as the insulating layer 174.

Figure 10:
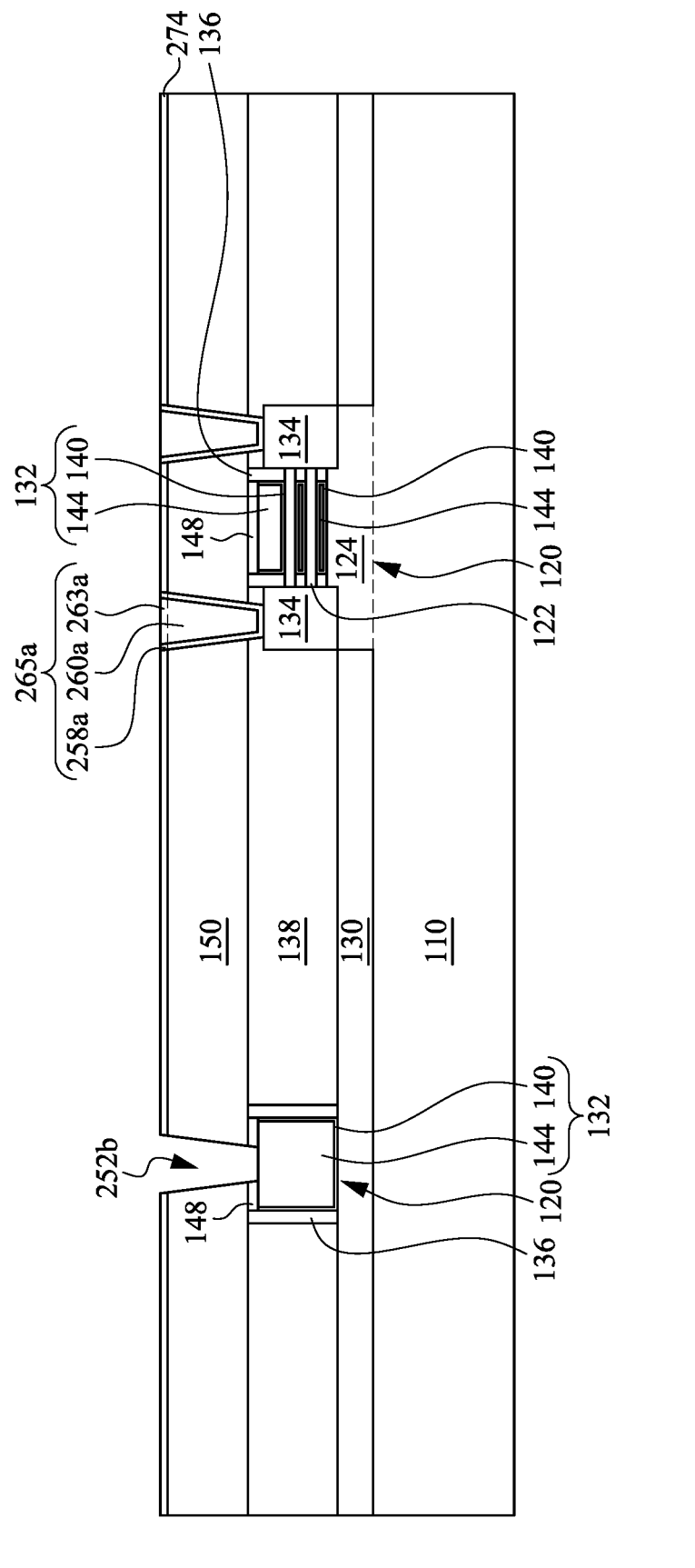

In FIG. 10, openings 252b for forming the contact plugs 265b are formed in the second ILD 150 and the gate mask 148 to expose a surface of the conductive gate layer 144 of the gate structure 132 in accordance with some embodiments. The openings 252b may be formed using similar processes as the openings 152b where the photolithography process and etching processes for forming the openings 252b does not include forming openings for exposing the source/drain regions 134.

Figure 11:
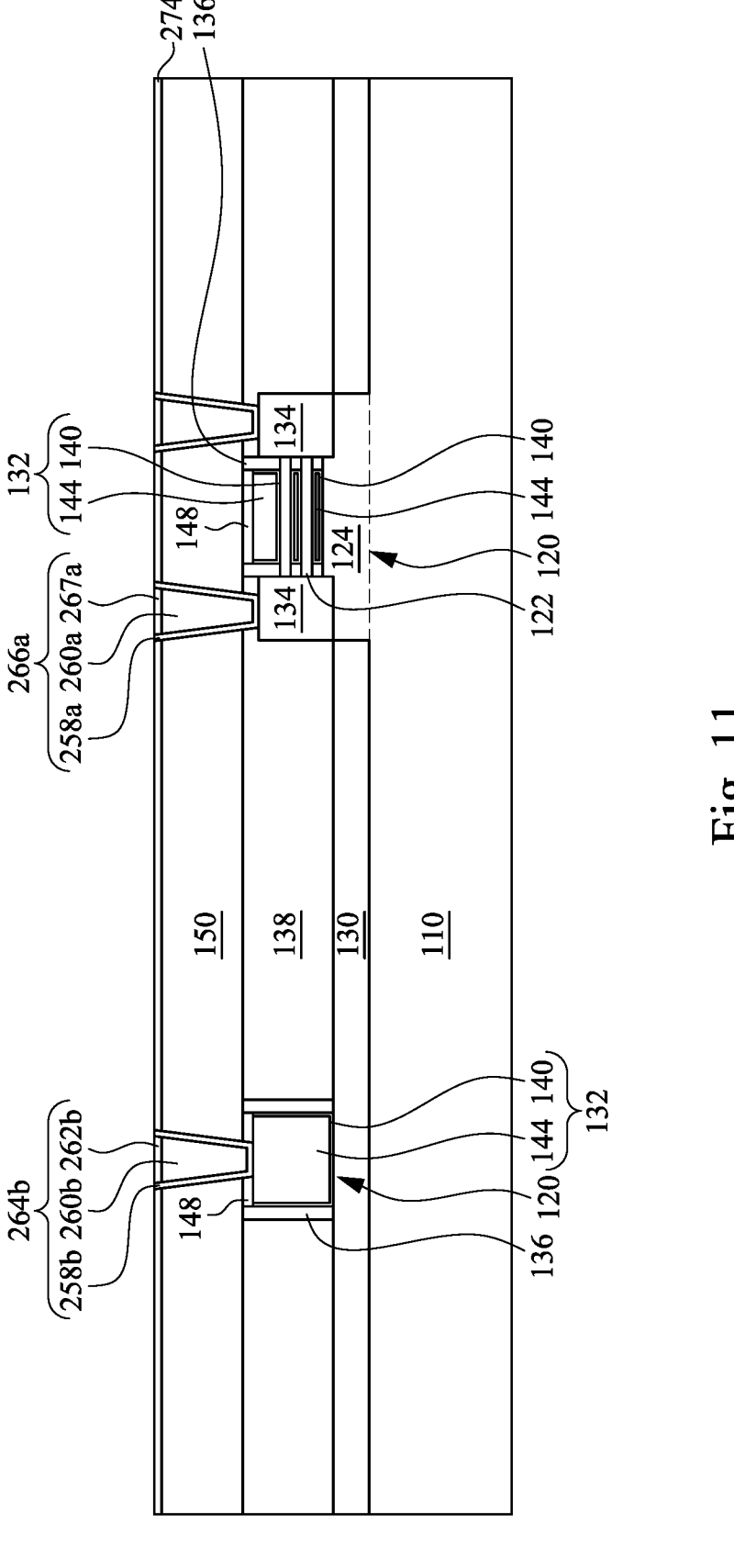

In FIG. 11, a conductive layer is formed in the openings 252b and over the insulating layer 274 and then planarized to form the contact plugs 264b in the openings 252b using the same material and formation processes illustrated in FIGS. 1-7. In some embodiments, the wet cleaning process of a CMP for forming the contact plugs 264b may oxidize the upper portions of the contact plugs 265a and 264b. As such, one resulting contact plug 266a may include a conductive liner 258a, a first portion 260a formed of the conductive material disposed over the conductive liner 258a, and a second portion 267a formed of oxide of the conductive material disposed over the first portion 260a of the contact plug 266a. The conductive liner 258a, the first portion 260a of the contact plug 266a, and the second portion 267a of the contact plug 266a may have the same or similar characteristics or properties as the conductive liner 158b, the first portion 160a of the contact plug 164a, and the second portion 162a of the contact plug 164a, respectively. In some embodiments, one resulting contact plug 264b may include a conductive liner 258b, a first portion 260b formed of the conductive material disposed over the conductive liner 258b, and a second portion 262b formed of oxide of the conductive material disposed over the first portion 260b of the contact plug 264b. The conductive liner 258b, the first portion 260b of the contact plug 264b, and the second portion 262b of the contact plug 264b may have the same or similar characteristics or properties as the conductive liner 158b, the first portion 160b of the contact plug 164b, and the second portion 162b of the contact plug 164b, respectively.

Figure 12:
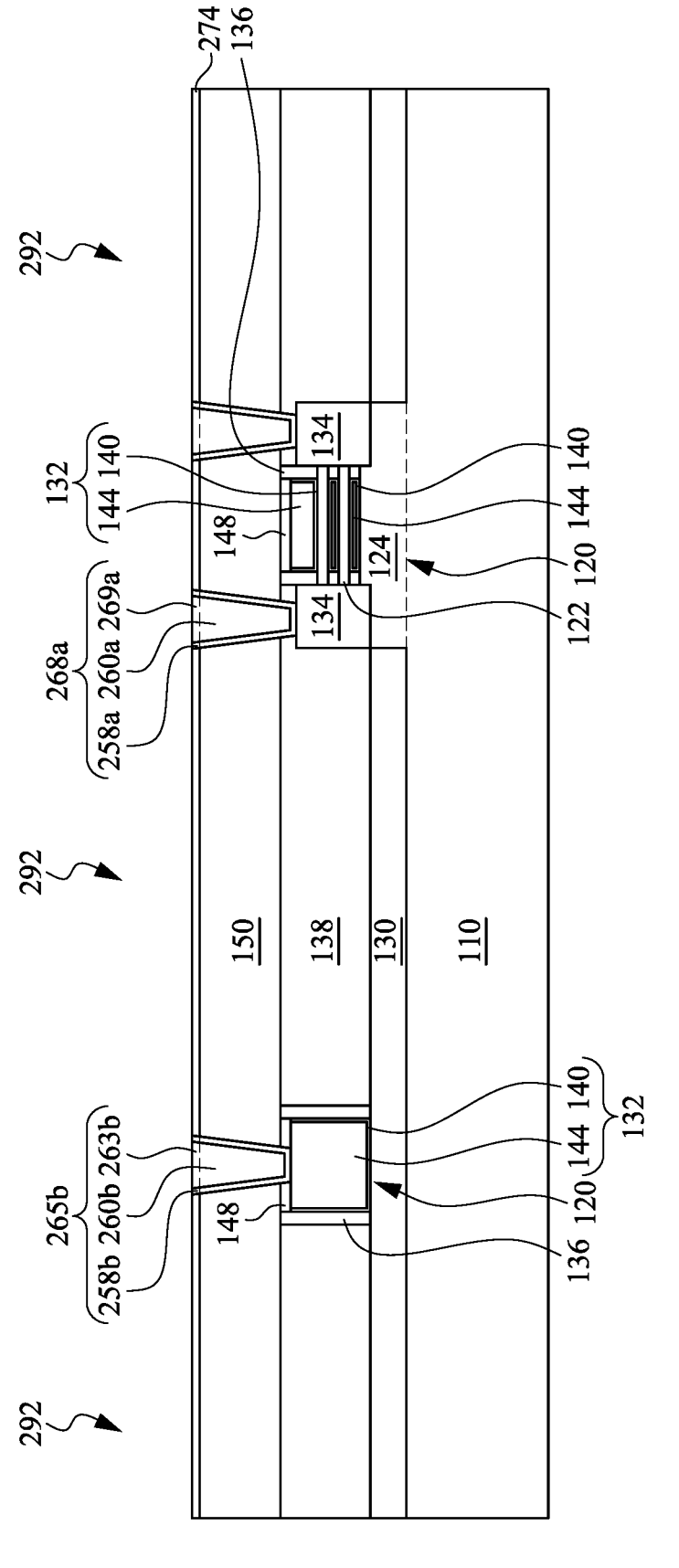

Next, in FIG. 12, the wafer (e.g., semiconductor device 200) is transferred to the deposition tool 400 (See FIG. 15) for depositing an ESL 270 and a third ILD 272 over the insulating layer 274 and the contact plugs 265a and 264b. In some embodiments, before the deposition of the ESL 170 and the third ILD 172, the wafer is transferred to the first chamber 402 of the deposition tool 400 to perform a second treatment 292 in accordance with some embodiments. The second treatment 292 may be performed using the same parameters as the pre-deposition treatment 190 and/or the first treatment 290. Thus, the oxide of conductive material in the second portions 267a and 262b may be converted to a metal state of the conductive material (e.g., reducing tungsten oxide to tungsten metal), thereby forming the contact plugs 268a and 265b. In the contact plugs 268a, both of the first portions 260a and the second portions 269a are formed of the conductive material (e.g., tungsten metal) and substantially oxide free in accordance with some embodiments. In the contact plugs 265b, both of the first portions 260b and the second portions 263b are formed of the conductive material (e.g., tungsten metal) and substantially oxide free in accordance with some embodiments.

Figure 13:
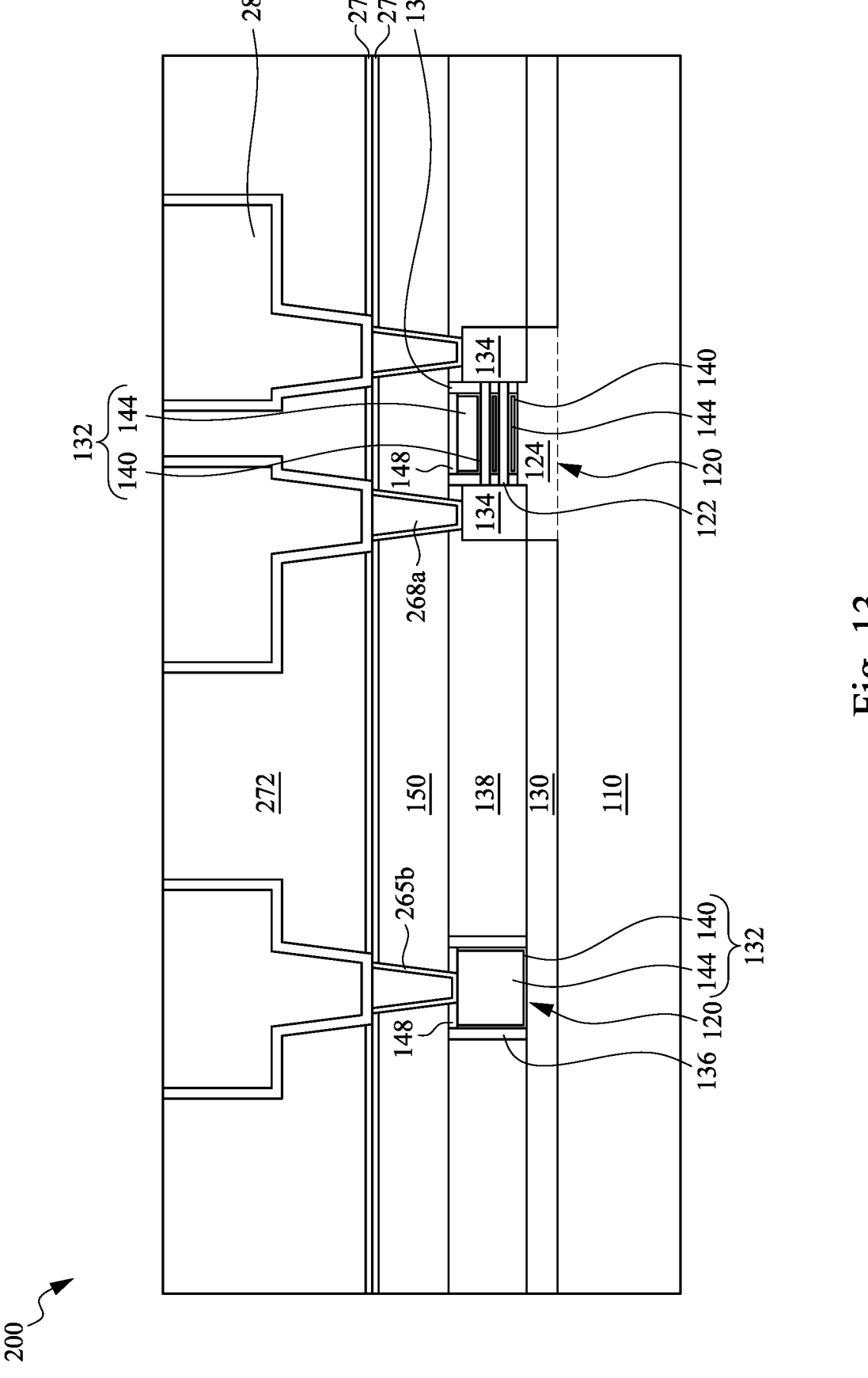

In FIG. 13, an ESL 270, a third ILD 272 and an interconnect 280 may be formed over the contact plugs 268a and 265b and the insulating layer 274. In some embodiments, the ESL 270, the third ILD 272, and the interconnect 280 may be formed using similar processes and materials as the ESL 170, the third ILD 172, and the interconnect 180, respectively. Following completion of the interconnect 280, additional metallization lines (not shown) and additional conductive vias (not shown) may be formed over the interconnect 280 using similar materials and similar processes as described above the interconnect 180.

Figure 14:
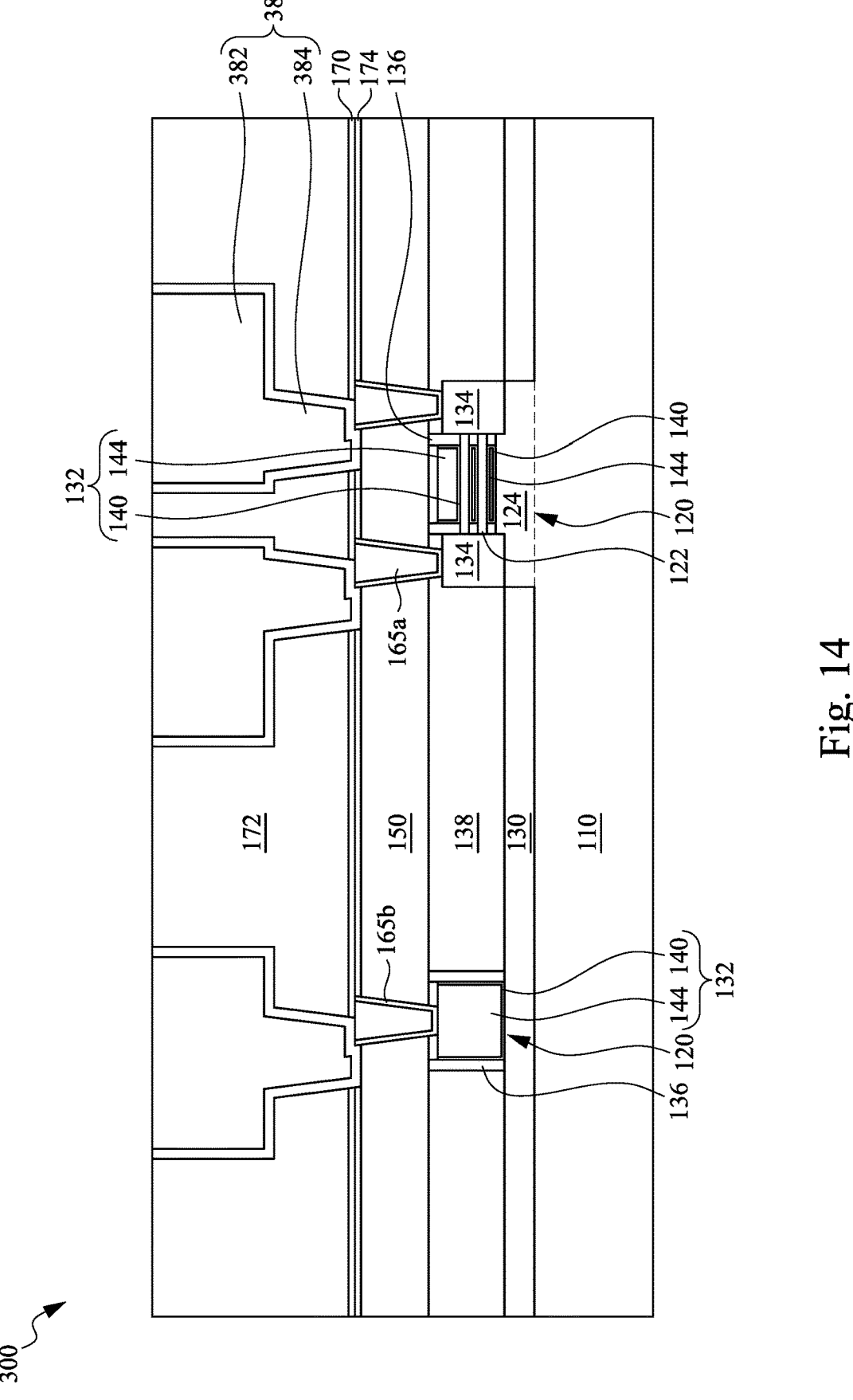

In FIG. 14, a semiconductor device 300 and methods for forming thereof are illustrated in accordance with some embodiments. The semiconductor device 300 may have similar structures (with similar reference numerals referring to similar elements) to the semiconductor device 100 and may be formed by similar manufacturing processes, wherein that conductive vias 384 of an interconnect 380 may be in contact with sidewalls of the contact plugs 165a and 165b. In some embodiments, a portion of the top surface of the contact plugs 165a or the contact plugs 165b remain sealed by the ESL 170. For example, as illustrated in FIG. 14, the conductive vias 384 of the interconnect 380 are formed through the ESL 170, the insulating layer 174 and extend into a portion of the second ILD 150 adjacent to the contact plugs 165a or 165b to be in contact with sidewalls of the contact plugs 165a or 165b, in accordance with some embodiments. The formation of the interconnect 380 may be similar to the formation of the interconnect 180, where the etch process of forming openings for housing the interconnect 380 further etches through the insulating layer 174 and a portion of the second ILD 150. Because the conductive vias 384 of the interconnect 180 may be in contact with the sidewalls of the contact plugs 165a or 165b, the total contact area between the interconnect 380 and the contact plugs 165a or 165b may be increased, thereby reducing the resistance between the interconnect 380 and the contact plugs 165a or 165b. Following completion of the interconnect 380, additional metallization lines (not shown) and additional conductive vias (not shown) may be formed over the metallization lines 382 using similar materials and similar processes as the interconnect 180 described above.

As discussed above, a particular pre-deposition treatment may help to form a low-resistance contact to the contact plugs. The particular pre-deposition treatment may include exposing the contact plugs to a gas mixture of $NH_3$ and $N_2$ in suitable conditions, and the treatment may reduce oxidized portions of the contact plugs to a metal element while not forming nitride in or over the contact plugs. As a result, the subsequently formed upper-level interconnect may be in contact with the metal portions of the contact plugs, with little or no oxide or nitride formed therebetween, thereby providing a low resistance conducting route between the contact plugs and the upper-level interconnect. In addition, the pre-deposition treatment may also nitridize an upper portion of an insulating layer surrounding the contact plugs to form an insulating layer. The insulating layer may be a layer allows the upper-level interconnect to land on or acts as a protection layer that prevents the ILD surrounding the contact plugs from being over-etched during the formation of the interconnect.

In an embodiment, a method of forming a semiconductor device includes forming an electronic component over a substrate; forming a first insulating layer over the electronic component; forming a contact plug extending through the first insulating layer to the electronic component, wherein the contact plug includes a first portion formed of a conductive material and a second portion formed of an oxide of the conductive material disposed over the first portion; performing a treatment to expose the contact plug and the first insulating layer to a gas mixture of $N_2$ and $NH_3$; after performing the treatment, forming a second insulating layer over the contact plug and the first insulating layer; and forming an interconnect in the second insulating layer and in contact with the contact plug. In an embodiment, forming the contact plug includes: forming an opening in the first insulating layer; forming a conductive layer in the opening and over the first insulating layer; and performing a chemical mechanical polish process, wherein the chemical mechanical polish process includes a polishing step and a wet cleaning step. In an embodiment, the wet cleaning step of the chemical mechanical polish process oxidizes an upper portion of the remaining portions of the conductive layer to form the oxide of the conductive material. In an embodiment, the conductive material is tungsten metal, and the treatment reduces tungsten oxide in the second portion of the contact plug to tungsten metal. In an embodiment, the treatment converts an upper portion of the first insulating layer to a third insulating layer, wherein the third insulating layer includes silicon nitride, silicon oxynitride, or a combination thereof. In an embodiment, the third insulating layer has a top surface level with a top surface of the contact plug. In an embodiment, the method further includes forming an etch stop layer over the first insulating layer and the contact plug after performing the treatment and before forming the second insulating layer, wherein the etch stop layer includes aluminum oxide, aluminum nitride, silicon carbide, or a combination thereof. In an embodiment, the steps of performing the treatment and forming the second insulating layer are performed in different chambers of a deposition tool. In an embodiment, a concentration ratio of $N_2$ to $NH_3$ in the gas mixture is 2 to 16. In an embodiment, the treatment is performed at a temperature of 340° C. to 400° C. for 12 seconds to 24 seconds.

In an embodiment, a method of forming a semiconductor device includes forming a first conductive feature and a second conductive feature over a substrate; forming a first insulating layer covering the first conductive feature and the second conductive feature; forming a first contact plug in the first insulating layer and in contact with the first conductive feature, the first contact plug being formed of a conductive material, the first contact plug having a first oxidized upper surface, the first oxidized upper surface of the first contact plug being formed of an oxide of the conductive material; performing a first treatment, wherein the first treatment includes exposing the first oxidized upper surface of the first contact plug and an upper surface of the first insulating layer to a gas mixture of $N_2$ and $NH_3$; after performing the first treatment, forming a second contact plug in the first insulating layer and in contact with the second conductive feature, the second contact plug being formed of the conductive material, the second contact plug having a second oxidized upper surface, the second oxidized upper surface of the second contact plug being formed of the oxide of the conductive material; and performing a second treatment to the second contact plug, wherein the second treatment exposes the second oxidized upper surface of the second contact plug to a gas mixture of $N_2$ and $NH_3$. In an embodiment, the first conductive feature is one of a gate structure and a source/drain region, and the second conductive feature is another of the gate structure and the source/drain region. In an embodiment, forming the second contact plug includes performing a chemical mechanical polish process, wherein the chemical mechanical polish process includes washing top surfaces of the first contact plug and the second contact plug. In an embodiment, performing the first treatment reduces the first oxidized upper surface of the first contact plug to the conductive material. In an embodiment, the first treatment nitridizes the upper surface of the first insulating layer. In an embodiment, a concentration ratio of $N_2$ to $NH_3$ in the gas mixture is 2 to 16.

In an embodiment, a semiconductor device includes an electronic component including source/drain regions and a metal gate structure over a substrate; a first insulating layer covering the source/drain regions and a top surface of the metal gate structure; a second insulating layer disposed over the first insulating layer, wherein the second insulating layer includes silicon nitride, silicon oxynitride, or a combination thereof; a contact plug extending through the second insulating layer and the first insulating layer to the source/drain regions or the metal gate structure, wherein the contact plug has a top surface substantially level with a top surface of the second insulating layer; a third insulating layer disposed over the contact plug and the second insulating layer; and an interconnect disposed in the third insulating layer and in contact with the contact plug. In an embodiment, the interconnect has a bottom surface substantially level with the top surface of the second insulating layer. In an embodiment, the semiconductor device further includes a fourth insulating layer disposed between the second insulating layer and the third insulating layer, wherein the fourth insulating layer includes aluminum oxide, aluminum nitride, silicon carbide, or combinations thereof. In an embodiment, the interconnect extends through the second insulating layer and a portion of the first insulating layer, wherein the interconnect is in contact with a sidewall of the contact plug.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming an electronic component over a substrate;
   forming a first insulating layer over the electronic component;
   forming a contact plug extending through the first insulating layer to the electronic component, wherein the contact plug comprises a first portion formed of a conductive material and a second portion formed of an oxide of the conductive material disposed over the first portion;
   performing a treatment to expose the contact plug and the first insulating layer to a gas mixture of $N_2$ and $NH_3$, wherein a concentration ratio of $N_2$ to $NH_3$ in the gas mixture is 2 to 16, wherein the treatment converts an upper portion of the first insulating layer to a second insulating layer, wherein the second insulating layer comprises silicon nitride, silicon oxynitride, or a combination thereof;
   after performing the treatment, forming a third insulating layer over the contact plug and the first insulating layer; and
   forming an interconnect in the third insulating layer and in contact with the contact plug.

2. The method of claim 1, wherein forming the contact plug comprises:
   forming an opening in the first insulating layer;
   forming a conductive layer in the opening and over the first insulating layer; and
   performing a chemical mechanical polish process, wherein the chemical mechanical polish process comprises a polishing step and a wet cleaning step.

3. The method of claim 2, wherein the wet cleaning step of the chemical mechanical polish process oxidizes an upper portion of a remaining portion of the conductive layer to form the oxide of the conductive material.

4. The method of claim 1, wherein the conductive material is tungsten metal, and the treatment reduces tungsten oxide in the second portion of the contact plug to tungsten metal.

5. The method of claim 1, wherein the second insulating layer has a top surface level with a top surface of the contact plug.

6. The method of claim 1, further comprising forming an etch stop layer over the first insulating layer and the contact plug after performing the treatment and before forming the third insulating layer, wherein the etch stop layer comprises aluminum oxide, aluminum nitride, silicon carbide, or a combination thereof.

7. The method of claim 1, wherein the steps of performing the treatment and forming the third insulating layer are performed in different chambers of a deposition tool.

8. The method of claim 1, wherein the treatment is performed at a temperature of 340° C. to 400° C. for 12 seconds to 24 seconds.

9. The method of claim 1, wherein the contact plug further comprises a conductive liner between the first portion and the electronic component.

10. A method of forming a semiconductor device, the method comprising:
   forming a first conductive feature and a second conductive feature over a substrate;
   forming a first insulating layer covering the first conductive feature and the second conductive feature;
   forming a first contact plug in the first insulating layer and in contact with the first conductive feature, the first contact plug being formed of a conductive material, the first contact plug having a first oxidized upper surface, the first oxidized upper surface of the first contact plug being formed of an oxide of the conductive material;
   performing a first treatment, wherein the first treatment comprises exposing the first oxidized upper surface of the first contact plug and an upper surface of the first insulating layer to a first gas mixture of $N_2$ and $NH_3$;
   after performing the first treatment, forming a second contact plug in the first insulating layer and in contact with the second conductive feature, the second contact plug being formed of the conductive material, the second contact plug having a second oxidized upper surface, the second oxidized upper surface of the second contact plug being formed of the oxide of the conductive material; and
   performing a second treatment to the second contact plug, wherein the second treatment exposes the second oxidized upper surface of the second contact plug to a second gas mixture of $N_2$ and $NH_3$.

11. The method of claim 10, wherein the first conductive feature is one of a gate structure and a source/drain region, and the second conductive feature is another of the gate structure and the source/drain region.

12. The method of claim 10, wherein forming the second contact plug comprises performing a chemical mechanical polish process, wherein the chemical mechanical polish process comprises washing top surfaces of the first contact plug and the second contact plug.

13. The method of claim 12, wherein performing the first treatment reduces the first oxidized upper surface of the first contact plug to the conductive material.

14. The method of claim 10, wherein the first treatment nitridizes the upper surface of the first insulating layer.

15. The method of claim 10, wherein a concentration ratio of $N_2$ to $NH_3$ in the first gas mixture is 2 to 16.

16. A method of forming a semiconductor device, the method comprising:
   forming a first insulating layer and a first structure in the first insulating layer, the first structure comprising a first conductive material layer and a first oxide layer over the first conductive material layer, the first conductive material layer comprising a first material, the first oxide layer comprising an oxide of the first material;

performing a first treatment, wherein the first treatment comprises exposing the first oxide layer to a gas mixture of $N_2$ and $NH_3$, wherein the first treatment nitridizes an upper surface of the first insulating layer;

after performing the first treatment, forming a second insulating layer over the first structure and the first insulating layer; and forming a first interconnect in the second insulating layer, the first interconnect being in electrical contact with the first conductive material layer.

17. The method of claim 16, further comprising, after performing the first treatment and prior to forming the first interconnect:

forming an opening in the first insulating layer;

forming a second structure in the opening, the second structure comprising a second conductive material layer and a second oxide layer over the second conductive material layer, the second conductive material layer comprising a second material, the second oxide layer comprising an oxide of the second material; and performing a second treatment, wherein the second treatment comprises exposing the second oxide layer to a gas mixture of $N_2$ and $NH_3$.

18. The method of claim 16, wherein performing the first treatment reduces the first oxide layer to a conductive material.

19. The method of claim 16, wherein the first material comprises tungsten.

20. The method of claim 16, wherein a concentration ratio of $N_2$ to $NH_3$ in the gas mixture is 2 to 16.

* * * * *